United States Patent [19]  
Butter et al.

[11] 4,045,257  
[45] Aug. 30, 1977

[54] III(A)-V(B) TYPE LUMINESCENT DIODE

[75] Inventors: Ehrenfried Butter; Brigitte Jacobs; Klaus Jacobs; Konrad Unger; Alfred Zehe, all of Leipzig; Rainer Doss; Florian Kugler, both of Teltow, all of Germany

[73] Assignee: Jenoptik Jena G.m.b.H., Jena, Germany

[21] Appl. No.: 594,900

[22] Filed: July 10, 1975

Related U.S. Application Data

[62] Division of Ser. No. 282,190, Aug. 9, 1972, Pat. No. 3,911,462.

[51] Int. Cl.² .................. H01L 33/00; H01L 33/19
[52] U.S. Cl. .................... 148/171; 148/172; 148/187; 357/17; 357/18
[58] Field of Search ............ 357/17, 18; 148/171, 148/172, 189, 187, 186; 252/62.3 GA

[56] References Cited  
U.S. PATENT DOCUMENTS 3,560,276  12/1968  Panish et al. .................. 148/171
3,604,991  9/1971  Yonezu et al. .................. 148/171 X
3,617,820  11/1966  Herzog .......................... 148/186 X
3,642,544  2/1972  Keyes et al. .................... 148/186 X
3,874,952  4/1975  Woodall ........................ 148/171

Primary Examiner—G. Ozaki  
Attorney, Agent, or Firm—Nolte and Nolte

[57] ABSTRACT

Due to its dopant structure, the radiant band of a III(A) - V(B) type luminescent diode, emitting light radiation in the plane of the PN-junction, possesses differences in delay time of $\leq 10^{+10}$ seconds, which permit an extension to higher frequencies.

The dopant structure is characterized by an $n^+$ type basic material incorporating an impurity concentration of $N_D \geq 10^{18}$ cm$^{-3}$, and by a graded acceptor dopant profile which within the radiant region has a gradient of $\leq 10^{22}$ cm$^{-4}$ and a gradient of $\geq 10^{23}$ cm$^{-4}$ in the vicinity of the $p^+$ region. Thus the injection conditions in respect to the quantum efficiencies and to the frequency range are improved. The diode is fabricated by a diffusion process and/or a liquid epitaxial process, in which definite temperatures and time relations have to be satisfied.

1 Claim, 6 Drawing Figures

III(A)-V(B) TYPE LUMINESCENT DIODE

This is a division of application Ser. No. 282,190 filed Aug. 9, 1972, and now U.S. Pat. No. 3,911,462.

BACKGROUND OF THE INVENTION

This invention concerns a III(A)-V(A) type semiconductor luminescent diode, possessing a highly doped $p+$ region, i.e., having an impurity concentration greater than about $4 \times 10^{19}$ atomic/cc, a highly doped $n+$ region, i.e., having an impurity concentration greater than about $10^{18}$ atoms/cc, and an intermediate p radiative recombination region, in which the radiation light is emitted in the plane of the PN-junction. The radiative layer of such diodes is narrow seen from the side, the width being about 20 microns; said layer possesses a high luminous density.

The current injected into such a diode is modulated for information transmission, in which — and in many other applications — the recombination delay time between discrete points has to be constant.

III(A)-V(A) type semiconductor electroluminescent diodes are generally known. The luminescence in such diodes originates in the vicinity of a PN-junction, due to recombination of electrons with defect electrons, which occurs under light emission. Numerous investigations have already been carried out concerning an increase of the light emitting efficiency. The following results have been obtained.

In order to decrease the absorption by free charge carriers due to the high carrier injection, the compensation within the radiative layer has to be comparatively high ($N_A \approx N_D$).

The presence of nearly the same number of both donors and acceptors within the radiative layer results in "shallow" acceptor dopant gradients.

The recombination layer of high compensation degree inserted between the p and N layers, has to be chosen at least as large as the distance of diffusion ($L_n$) of the injected carriers.

Under the condition of equal interior quantum efficiencies, the luminescence intensity of the radiation from the active layer is — due to absorption and leakage — higher when laterally emitting compared to a PN-layer-traversing radiation.

The light modulation by means of the injection current permits the application of such diodes in a simple transmission system.

Measurements have been carried out on conventional luminescent diodes with respect to the delay times between excitation and light emission.

The differences in the results of the measurements of the light emitted parallel to the PN-junction differed from those perpendicular to the junction reaches up to about $10^{-8}$ seconds. Diodes suffering from such magnitudes of local differences in delay time cannot find application in precision distance measuring devices, operating on the radar principle.

Large local differences in the delay time result in severe deteriorations of the exactness of the measuring results. If one considers such local deviations in respect to the delay time, coupled emitter circuits, which, for example, are employed in logic optimum operations, or optical signal storing, or emitted-radiation-into-intensity-oscillation conversion, are only applicable for frequencies below $10^8$ Hz.

Owing to this fact, the advantage inherent in luminescent diodes, namely to modulate up to very high frequencies, cannot be exploited. Differences in injection and absorption within the active layer affect the magnitude of the local differences in delay time, which in turn cause the aforementioned disadvantages. Said disadvantages are not restricted to laterally emitting electroluminescent diodes but also occur with those having PN-layer-traversing radiation.

BRIEF SUMMARY OF THE INVENTION

Therefore, it is an object of the present invention to obviate the above disadvantages.

It is a further object to increase the radiant density of electroluminescent diodes and to enhance their operational range.

It is a final object to substantially reduce the local differences with respect to the delay time of the light, emitted from the PN-junction, in which the measured differences are measured in the direction parallel to the perpendicular passing through the PN-junction plane.

According to the present invention the local differences in delay time are reduced in that the $p+$ region of the electroluminescent diode consists of a basic material which is doped to a donor impurity concentration of $N_D \geq 10^{18}$ per cubic centimeter and in that the acceptor dopant profile possesses two dopant gradients within the p radiative layer, one of the gradients amounting to $\leq 10^{22}$ cm$^{-4}$, the other which occurs in vicinity of the $p+$ region, having a value of $\geq 10^{23}$ cm$^{-4}$. The entire radiative layer exhibits local differences in delay time of $\leq 10^{-10}$ seconds.

Across the intensity maximum of the radiative layer the absorption coefficient of said profile is small and substantially constant within the half width and symmetrically increasing towards the $n+$ and $p+$ regions above the half width. The half width most suited for obtaining a high radiant density with such electroluminescent diodes extends to 10 microns as a maximum, the constant delay time being $< 1\%$ of the above mentioned delay time, the total width of the active radiative layer being about 20 microns. According to the invention, the behavior of the absorption coefficient can be derived from the shape and position of the intensity maximum of the angular dependent lobe emission, i.e., of the far field relative to the optical axis. Thus a symmetrical radiant lobe is indicative of low differences in the absorption coefficient within the half width of the radiant range. The maximum of said radiant lobe lies within the PN-junction plane, which also includes the optical axis, said lobe showing a flat rise in the ambiency of the maximum. Due to the dependence from the absorption coefficient on the number of free charge carriers and defect terms, the symmetrical absorption profile can be transformed into a corresponding dopant profile.

The electroluminescent diode of the invention can be produced by either a liquid epitaxial process and/or by a diffusion process, both being followed by suitable aftertreatments, such as annealing, of a discretely set dopant profile. If GaAs is used as a basic material, a dopant amount of $N_D \geq 10^{18}$ cm$^{-3}$ is required.

The n-dopant elements are selected from Sn, Si and Te; and as an acceptor element ($N_A$) Zn is used.

BRIEF DESCRIPTION OF THE DRAWINGS

In order that the invention may be more readily understood, reference is made to the accompanying drawings which illustrate diagrammatically and by way of example two embodiments thereof, and in which.

DETAILED DESCRIPTION

Figure 1:
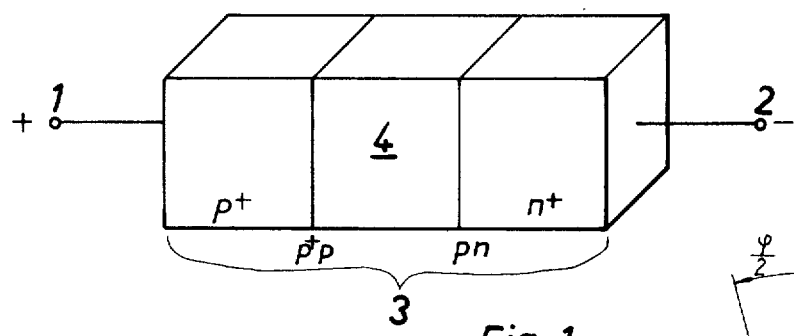
FIG. 1 shows a semiconductor structure.

Referring in more detail to FIG. 1, a luminescent diode 3 comprises a p-type layer $p^+$, and n-type layer $n^+$, both contiguous to an intermediate p-radiant layer 4, thereby forming a $p^+p$ junction and a $pn$ junction, respectively. At their outer ends, said $p^+$ and $n^+$ type layers are provided with contacts 1 and 2.

If the contacts 1 and 2 are supplied with a current in accordance with the signs of the poles, the layer 4 will emit a radiation.

Figure 2:
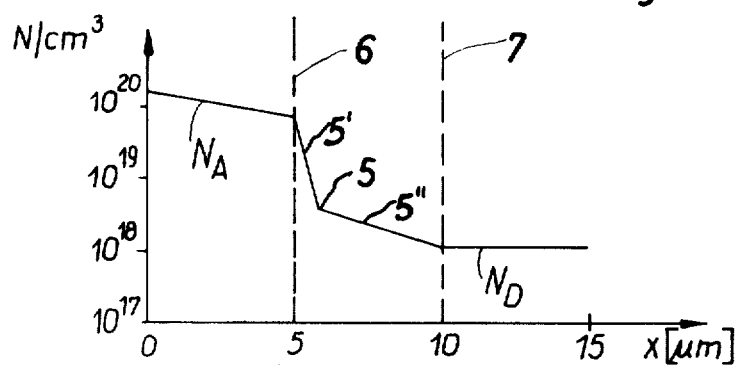
FIG. 2 shows a dopant profile.

In FIG. 2, the number of impurities (in $N/Cm^3$) are plotted along the y-axis as a function of the layer position $x$ (in microns) from the surface along the x-axis.

Within the $p^+$-type layer, the number of acceptor type impurities $N_A$ dominates, whereas within the $n^+$-type layer, the donor impurities $N_D$ are predominant. This relation is indicated by the line 5 which includes the two gradients 5' ($\geq 10^{23} cm^{-4}$) and 5" ($\leq 10^{22} cm^{-4}$). The dotted lines 6 and 7 correspond to the junctions $p^+p$ and pn, respectively.

Figure 3:
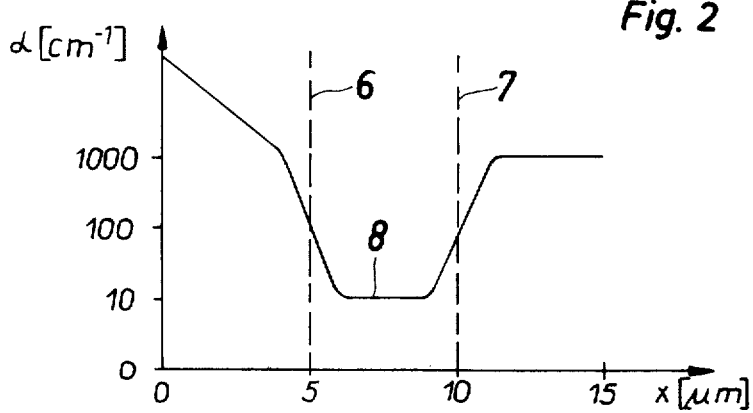
FIG. 3, an absorption profile.

In FIG. 3 the absorption coefficients $\alpha(cm^{-1})$ is plotted along the y-axis versus the position $x$ (in microns).

The course of the line 8 indicates an absorption within the radiative layer 4, substantially lower than within the $p^+$ and $n^+$ junction layers. Furthermore, the absorption within the range of the maximum radiance is approximately constant, and symmetrically increases above the half width towards both, the $p^+$ and $n^+$ regions.

Figure 4:
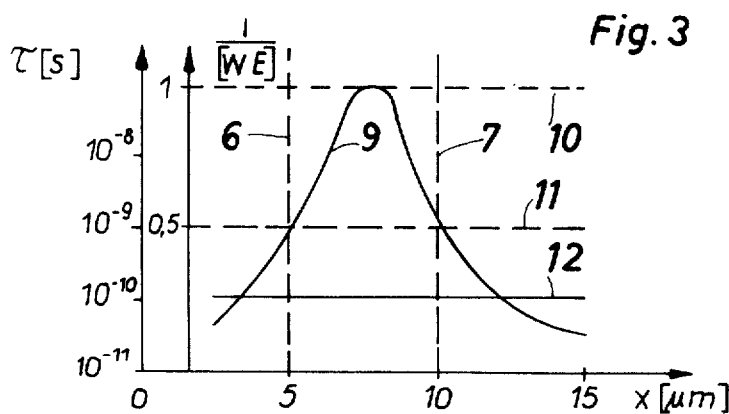
FIG. 4 represents the intensity and homogeneity of the delay time as a function of the radiant band width.

In FIG. 4, in the diagram, both the radiation intensity I (in arbitrary units WE) and the delay time $\tau$ (in seconds) are plotted along the y-axis as a function of position $x$ (in microns).

Curve 9 indicates the intensity distribution of the radiation emitted by said electroluminescent diode 3.

At the dotted lines 6 and 7, which correspond to the respective junctions, the intensity has dropped by half the maximum 10. The accordingly defined half width 11 corresponds to the distance between the two lines 6 and 7. The delay time of the emitted radiation is constant and illustrated by line 12, which is parallel to the x-axis, with its maximum value $10^{-10}$ seconds.

Figure 5:
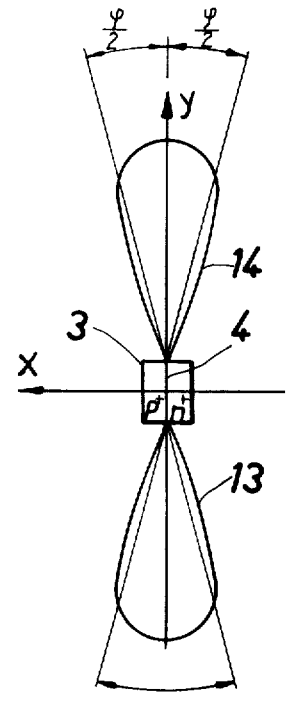
FIGS. 5 and 6 show the far field of the diode in two different planes.

In FIG. 5, an electroluminescent diode 3 is so arranged in the plane defined by the x- and y-axes that the radiative layer 4 is at right angles to the drawing plane.

Two lobes 13 and 14, symmetrically arranged to the y-axis, are an illustration of the radiation intensity in the drawing plane. The aperture angle of the radiant lobes 13 and 14 is designated by $\phi$.

Figure 6:
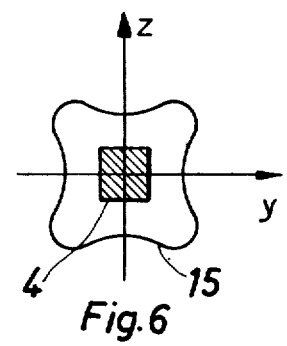

In FIG. 6, curve 15 illustrates the distribution of radiant density within the plane of the radiative layer 4 of said electroluminescent diode.

The luminescent diode and in particular the $p^+ pn^+$ structure is fabricated by a liquid epitaxial deposition process.

Employing a modified Nelson tilting device *, a graphite boat, loaded with the melt, is inserted in a sealable ampule, which is adapted to prevent the zinc from being distilled off. The diode structure (symmetrical absorption profile) required is obtained by both a suitable composition of the nonstoichiometric melt and an adequate heat input. A total mass of 5g melt is composed in the following relations:

GaAs : Ga : Al and Zn = 1 : 0.028 to 4.7:0.02 : 0.03.

* H. NELSON RCA Review 24, 603 (1963)

Aluminum is added to modify the absorption behavior.

The maximum temperature before the growing process should not be allowed to exceed 960° C. The growing process itself is carried out at temperatures between 930° C and 780° C and at a cooling rate of 3° C per minute.

In order to obtain the desired symmetrical absorption profile, the material is enclosed in a quartz tube, which had been sealed at 400° C, and is subsequently tempered at 960° C in a hydrogen atmosphere for 90 minutes.

The composition of melt and the doping of the basic materials can, of course, be varied. According to different substrate donor concentrations, the composition of the melt, and the time-temperature relation undergoes changes in the following range:

GaAs : Ga : Al = 1 : 4.6 to 4.76 : 0.015 to 0.028 : 0.03;
cooling rate 0.5 to 10° C/minutes;

tempering process for 0.1 to 3 hours at temperatures of 900° C to 1000° C. Alternatively, the electroluminescent diode of the invention may be fabricated by a diffusion process with the use of a one-furnace system and utilizing ampules of five milliliter. Five percent of a zinc-arsenic compound are weighed in, out of a 50 atomic percent As, related to the total sample weight of the basic GaAs material. The diffusion temperatures lie between 950° C and 1050° C and last for 30 to 5 minutes at a heating and cooling rate of 10° C per minute.

Depending on the basic doping, the resulting diffusion profile shows a penetration depth up to 40 microns, measured by the break-down method. Furthermore, said diffusion profile possesses a region of about 8 microns in length which exhibits low differences in concentration. Viewed from the PN-junction, said profile increases toward the $p^+$ layer to about 2 $N_D$, subsequently having a break in the vicinity of the $p^+p$ junction from where it steeply increases to a concentration value of $N_A \approx 8 \cdot 10^{19}/cm^3$ within 1 to 3 microns, i.e., at the $p^+p$ junction.

It is also feasible to obtain such doping at low temperatures and at longer diffusion rates.

The technological critical range is given by the precipitation free introduction of impurities.

In a further alternative manner, the required symmetrical absorption profile, as characterized by the above measured dopant profile, can be produced by a two-step diffusion process, firstly, incorporating a very shallow doping profile (diffused from a ZnGa source containing one weight percent gallium), and secondly, subsequently thereto, incorporating a steep $p^+p$ profile (diffused from a $Zn_3As_2$ to $ZnAs_2$ source).

By virtue of the invention, the electroluminescent diode, having modulated radiance, can be utilized at higher frequencies than those previously known, which includes a considerable increase in the applicational range. Thus, the accuracy limit with, for example, measuring operations such as the optical coincidence, can be decisively improved.

We claim:

1. A method for producing a luminescent diode comprising providing a monocrystalline $G_aA_s$ wafer substrate doped with a material of the group consisting of Si, Sn and Te, at a concentration of $N_D = 10^{18}$ atoms/cc, to be $n+$ conductive, then depositing a small $p+$ layer on said substrate, by a liquid epitaxy process from a non-stoichiometric melt composed of GaAs, Ga, Al and Zn with a weight ratio of 1:4.6 to 4.76:0.015 to 0.028:0.03, by cooling at a rate of 0.5° to 10° C per minute from an initial temperature of about 930° C to a final temperature of about 780° C, whereby $Z_n$ diffuses a short distance into the substrate during growth, to produce a structure of the form:

$$n^+\text{-GaAs/p -GaAs/p}^+\text{-Ga}_x\text{Al}_{1-x}\text{As,}$$

then subjecting the resultant structure, after separation from the melt solution, to a temperature process in a substantially hermetically closed system, at 900° C to 1000° C for 0.1 to 3 hours, in $H_2$ atmosphere, whereby the $Z_n$ from the $p+$ region diffuses further into the substrate and results in an expanded light-emitting p-GaAs layer having an acceptor dopant profile with two dopant gradients, the greater of said gradients being toward said $p+$ region.

* * * * *